US009342102B2

(12) United States Patent
Kim

(10) Patent No.: US 9,342,102 B2
(45) Date of Patent: May 17, 2016

(54) CASE FOR PORTABLE DEVICE AND METHOD OF CONTROLLING AN OPERATION OF TURNING A SCREEN OF THE PORTABLE DEVICE ON AND OFF BY USING SAME

(71) Applicant: Duk Seung Kim, Seoul (KR)

(72) Inventor: Duk Seung Kim, Seoul (KR)

( * ) Notice: Subject to any disclaimer, the term of this patent is extended or adjusted under 35 U.S.C. 154(b) by 37 days.

(21) Appl. No.: 14/179,317

(22) Filed: Feb. 12, 2014

(65) Prior Publication Data

US 2014/0159839 A1 Jun. 12, 2014

Related U.S. Application Data

(63) Continuation-in-part of application No. PCT/KR2012/006433, filed on Aug. 13, 2012.

(30) Foreign Application Priority Data

Aug. 13, 2011 (KR) .......................... 10-2011-0080933

(51) Int. Cl.
| | |
|---|---|
| *G06F 1/16* | (2006.01) |
| *H04B 1/3888* | (2015.01) |
| *H01H 36/00* | (2006.01) |
| *H05K 9/00* | (2006.01) |
| *A45C 13/00* | (2006.01) |
| *A45C 11/00* | (2006.01) |

(52) U.S. Cl.
CPC ............ *G06F 1/1628* (2013.01); *A45C 13/004* (2013.01); *H01H 36/00* (2013.01); *H04B 1/3888* (2013.01); *H05K 9/0007* (2013.01); *A45C 2011/002* (2013.01)

(58) Field of Classification Search
CPC .................................................. G06F 1/1628
See application file for complete search history.

(56) References Cited

U.S. PATENT DOCUMENTS

| | | | | |
|---|---|---|---|---|
| 5,867,140 | A * | 2/1999 | Rader | 345/98 |
| 6,314,183 | B1 * | 11/2001 | Pehrsson et al. | 379/433.06 |
| 7,889,037 | B2 * | 2/2011 | Cho | H04M 1/0237 335/222 |
| 8,746,446 | B2 * | 6/2014 | Chiang | 206/320 |
| 2005/0236848 | A1 * | 10/2005 | Kim | E05C 19/16 292/251.5 |
| 2006/0022822 | A1 * | 2/2006 | Wong et al. | 340/568.1 |
| 2006/0116183 | A1 * | 6/2006 | Infanti | 455/575.8 |

(Continued)

FOREIGN PATENT DOCUMENTS

| | | |
|---|---|---|
| JP | 11186929 A | 7/1999 |
| JP | 2004228959 A | 8/2004 |

(Continued)

OTHER PUBLICATIONS

International Search Report for PCT/KR2012/006433 mailed on Jan. 31, 2013.

*Primary Examiner* — Mohamad Musleh
(74) *Attorney, Agent, or Firm* — Patent Office of Dr. Chung Park

(57) ABSTRACT

The present invention relates to a protective case incorporating a magnet in a portion facing a magnetism sensor of a portable device, and to a method for controlling the action of turning the screen of the portable device on and off by using same, and relates to an invention for providing a function whereby it is possible to automatically turn the screen on and off depending on the action of the screen-protecting cover of the case, through the use of a method involving the incorporation of a geomagnetic sensor and of a magnet in a position corresponding thereto.

20 Claims, 8 Drawing Sheets

(56) References Cited

U.S. PATENT DOCUMENTS

| | | | |
|---|---|---|---|
| 2008/0302687 A1* | 12/2008 | Sirichai et al. | 206/320 |
| 2010/0016041 A1* | 1/2010 | Ying et al. | 455/575.4 |
| 2011/0095976 A1* | 4/2011 | Hwang et al. | 345/156 |
| 2011/0290687 A1* | 12/2011 | Han | 206/320 |
| 2012/0068798 A1* | 3/2012 | Lauder et al. | 335/306 |
| 2012/0308981 A1* | 12/2012 | Libin et al. | 434/362 |
| 2012/0325838 A1* | 12/2012 | Huang | 220/810 |

FOREIGN PATENT DOCUMENTS

| | | |
|---|---|---|
| KR | 1020090020942 A | 2/2009 |
| KR | 200446444 Y1 | 10/2009 |
| KR | 1020100130345 A | 12/2010 |

* cited by examiner

CASE FOR PORTABLE DEVICE AND METHOD OF CONTROLLING AN OPERATION OF TURNING A SCREEN OF THE PORTABLE DEVICE ON AND OFF BY USING SAME

CROSS REFERENCE TO RELATED APPLICATION

This application is a Bypass Continuation-In-Part (CIP) Application of International Application No. PCT/KR2012/006433 filed on Aug. 13, 2012 which claims the priority of Korean Patent Application No. 10-2011-0080933 filed on Aug. 13, 2011 in the KIPO (Korean Intellectual Property Office), the disclosures of which are incorporated by reference herein in their entirety.

TECHNICAL FIELD

The present invention relates to a case that protects a portable device having a screen, such as a smart phone or a tablet personal computer (PC), and more particularly to a technology that provides a function of enabling the operation of turning the screen on and off to be automatically performed in response to a movement of the screen protective cover of the case by using a geomagnetic sensor and a method of incorporating a magnet at a location facing that of the geomagnetic sensor.

BACKGROUND ART

In general, protective cases are used to prevent the outer surface of smart phones or tablet PCs from being damaged.

Such protective cases have been generally used to protect the back surface of portable devices. However, as devices using touch screens have gradually increased in number, front covers for the protection of screens are being applied.

DISCLOSURE

Technical Problem

An object of the present invention is to provide a protective case that enables the operation of turning a screen on and off to be automatically performed using a geomagnetic sensor that has not been frequently used in a portable device.

Another object of the present invention is to provide a control method that incorporates a magnet at a location corresponding to that of a geomagnetic sensor incorporated in a portable device, analyzes a signal applied by the magnet, and then enables the operation of turning a screen on and off to be smoothly performed.

Technical Solution

A protective case for a portable device according to the present invention includes a cover portion to cover the screen of the portable device; a magnet part incorporated in the cover portion; and a magnetic field shielding layer to prevent the screen from being turned off by a magnetic field from the magnet part, when the cover portion is folded to a back surface of the portable device.

In this case, the magnetic field shielding layer may be added to the magnet part to form a double layer structure.

Furthermore, the magnet part may be incorporated such that the portion of the magnet part that comes in contact with the portable device when the cover portion is completely closed forms an N pole (+).

Moreover, the magnet part may be incorporated such that an S pole (−) thereof is oriented toward an outside of the cover portion, and the protective case may further include a shielding layer for magnetic field disturbance formed on the surface of the magnet part having the S pole thereof.

Furthermore, the body fastening part may further include a cover fastening support part that prevents the cover portion from moving when the cover portion is closed.

Moreover, the body fastening part may further comprise an accommodating and fastening part that prevents the portable device from moving in an accommodated state.

A method of controlling an operation of turning a screen of a portable device on and off according to the present invention incorporates a magnet part in a cover portion that protects the screen of the portable device, allows the magnet part to apply a magnetic field signal to a geomagnetic sensor of the portable device as the cover portion comes in contact with the portable device, and controls turning off of the screen of the portable device by allowing the geomagnetic sensor to detect the magnetic field signal; and turning on of the screen of the portable device by allowing the geomagnetic sensor to detect removal of the magnetic field signal as the cover portion moves away from the portable device.

In this case, the applied magnetic field signal uses 1200 to 1999 uT. An exceptional rule that prevents the screen from being turned on and off when the magnetic field with a strength in a range of −1199 to 0 uT is applied.

In this case, an exceptional rule that prevents the screen from being turned on and off when the magnetic field with a strength in a range of −900 to 0 uT is applied.

Furthermore, an exceptional rule that determines that the signal detected by the geomagnetic sensor is reversed when the magnetic field has a strength lower than −1199 uT and that allows the screen to be turned on when the magnetic field has a strength in a range of −1999 to −1200 uT may be applied.

An option that allows a designated application to be executed at the same time that the screen is turned on may be included. An option that allows a running application to be automatically terminated at the same time that the screen is turned off may be included.

A method for executing an application of a portable device according to the present invention, the portable device comprising a screen covered by a foldable cover portion, the method comprising: sensing a change in a magnetic field strength applied by a magnet part of the foldable cover portion; and controlling an execution of a preset application based on the sensed change.

Advantageous Effects

The protective case and the control method using the protective case according to the present invention have the advantage of eliminating a need to directly manipulate buttons to turn the screen of the portable device on and off and the advantage of enabling the portable device to be rapidly manipulated only by an intuitive action similar to the operation of opening and closing of a book.

Furthermore, the protective case and the control method have the advantages of reducing device manufacturing cost and increasing processing yield rate because it is not necessary to incorporate an additional sensor that is used to perform the operation of turning the screen of the portable device on and off.

Moreover, the screen control method according to the present invention has the advantage of solving the problem that a battery is unnecessarily consumed by the erroneous operation of a screen-on button because a screen-off state can always be maintained when a cover is closed, and the advantage of enabling the portable device to be more efficiently manipulated because the time and effort required to press screen-on and off buttons can be reduced.

BEST MODE

Figure 1:
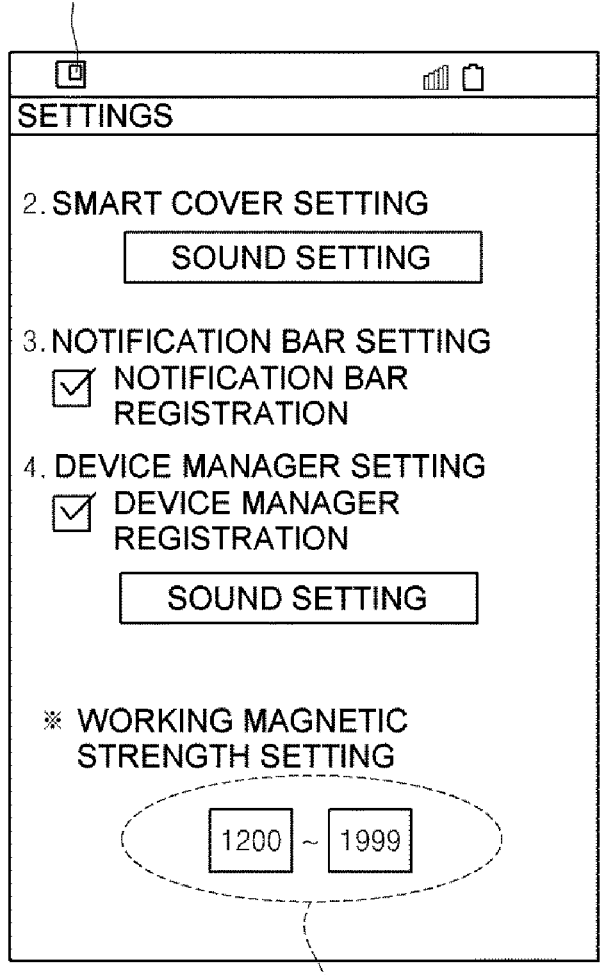
FIG. 1 shows a setting screen of a manager program showing a method of controlling the operation of turning a screen on and off according to the present invention.

The present invention is characterized in, as a base, incorporating a manager program that enables the operation of turning a screen on and off to be automatically performed by applying a magnetic field to a geomagnetic sensor incorporated in a portable device including a screen.

Geomagnetic sensors are incorporated in portable devices as a basic component that are currently being manufactured, such as smart phones or smart pads, in order to support a compass function. However, such geomagnetic sensors are not frequently used in general uses of portable devices are being used.

Meanwhile, as the displays of portable devices have gradually changed to large-sized screen displays, the number of buttons on the fronts of the portable devices has been minimized, and buttons that are used to perform the operation of turning the screens on and off have been generally implemented in the form of small-sized buttons disposed on the sides of the portable devices.

Meanwhile, a screen-on button should be pressed once in order to first use a portable device, while a screen-off button should be pressed once again in order to terminate the use of the portable device.

In this case, when the screen is maintained in an on state, the problem of high battery consumption occurs. For this reason, portable devices are designed to turn off screens when they remain in an unused state for a predetermined period of time. However, this cannot be a reliable solution because a screen-on state may be continued by unintentional manipulation.

In particular, as the sizes of the screens of portable devices increase, cases having a cover unit attached thereto, to protect a front surface of the screen are being introduced. Accordingly, as the covers come in contact with screens, a problem of the screen continuously staying at the screen-on state frequently occurs.

Furthermore, since buttons for turning the screen on and off have become smaller, the manipulation of the buttons become inconvenient.

Accordingly, the present invention is characterized in providing a protective case having a new concept-based smart cover that enables a screen to be turned off by the operation of simply closing the cover and to be turned on by the operation of simply opening the cover by using the case having the cover capable of protecting the front surface of the screen of a portable device, rather than using a screen-off and on buttons.

For this purpose, in the present invention, a geomagnetic sensor that is not frequently used in general operations of a portable device is utilized.

Recently, portable devices provide, as a basic function, a function of enabling the operation of selectively turning a screen on and off to be automatically performed using a proximity sensor or an illuminance sensor.

However, the proximity sensor or illuminance sensor enables a screen to be temporarily manipulated in special cases, such as during a phone call, and does not enable the operation of turning a screen on and off to be performed in all cases in which the portable device is used.

For example, in the case in which a setting is made using a proximity sensor so that a screen is turned off when the cover of the protective case is closed, the problem that the screen is turned off when the proximity sensor is unintentionally covered during the use is not solved.

Furthermore, in the case in which a setting is made using an illuminance sensor so that a screen is turned off at an illuminance when the cover of the protective case is closed, the problem that the operation of turning on a screen is not properly performed in a dark environment, such as in a darkroom or at night, may occur.

Due to the above-described problems, it has not been easy to control the operation of turning a screen on and off only making use of closing and opening movement of the cover of a portable device protecting case.

Accordingly, in order to automatically control the operation of turning a screen on and off, an additional auxiliary sensor should be added. However, when a new sensor is added, the problem of inefficiency occurs because the manufacturing cost of a device increases and the manufacturing process becomes complicated.

In the present invention, all of the above problems can be overcome using a geomagnetic sensor that is incorporated in a portable device as a basic component.

A method of turning a screen on and off using a magnetic signal that is applied to a geomagnetic sensor will be described as follows.

First, a plate-type magnet that can be incorporated in a cover in order to artificially apply a magnetic signal to the geomagnetic sensor is used. A product that can emit a magnetic field having a strength in the range of 0 to ±2000 uT based on the y-axis value when measured by the geomagnetic sensor of the portable device, may be used as the magnet.

However, since a magnetic field having a strength in the range of −100 to 500 uT may be applied by the Earth's magnetic field, the present invention uses a magnetic field having a strength in the range of +1200 to 1999 uT in order to be safe from all types of interference. Furthermore, an x- or z-axis value that is generated by the geomagnetic sensor is not consistent and the range of variations of the magnetic field is irregular. Accordingly, it is preferable not to use either of them as main setting values that are used in the present invention.

If a magnetic field having a strength lower than +1200 uT is used, an erroneous operation may occur because of the influence of the above-described Earth's magnetic field and other interferences. If a magnetic field has a strength higher than 1999 uT, the geomagnetic sensor may be broken and thus an erroneous operation may occur.

FIG. 1 illustrates the setting screen of a manager program illustrating a method of controlling the operation of turning a screen on and off according to the present invention.

As illustrated in FIG. 1, in the present invention, when the cover of a portable device is closed, a magnetic field with a strength of +1200 to 1999 uT is to be applied to the geomagnetic sensor incorporated in the portable device, and the manager program installed on the portable device analyzes the magnetic field input signal and causes the screen to be automatically turned off.

Meanwhile, when the cover is opened, the strength of the magnetic field is reduced to a value lower than the set value, and thus the screen would be automatically turned on.

In this case, the manager program according to the present invention includes a notification bar function indicating that the manager program is running on the portable device and the function of changing the setting value that is used to control the operation of the geomagnetic sensor.

Furthermore, while the manager program includes all additional functions needed, detailed descriptions thereof are omitted in order to protect the copyright of the program.

Additionally, in the present invention, in order to control more accurate operation, it is preferable to perform some additional exception processes.

For example, a plate-type magnet that is used in the present invention should be incorporated in a cover portion such that a magnetic field with a strength equal to or higher than +1200 uT is applied to the portable device and the N pole (+) of the magnet faces the portable device. Furthermore, the magnet should be incorporated such that the S pole (−) of the magnet faces the outer surface of the cover portion. Meanwhile, in this case, when the cover portion is opened and folded to the back surface of the portable device, a magnetic field from the S pole (−) of the magnet is applied to the geomagnetic sensor.

Accordingly, an exception process of preventing the operation of turning the screen off from being performed is needed in case the S pole (−) is applied to the geomagnetic sensor. In this case, it is preferred that the exception process is performed within a range from −1199~−900 uT to 0 uT.

In this case, the reason why the minimum strength for exceptional processing is set to −1199~−900 uT is that a reversal phenomenon naturally occurs in the geomagnetic sensor.

If the portable device is moved while a magnetic field with a strength of +1200 uT is being applied to the geomagnetic sensor, a geomagnetic sensor reversal phenomenon may naturally occur. In this case, the problem that in case of a removal of the magnet, the sensor becomes aware that a magnetic field with a strength of −1200 uT is applied arises. When such a phenomenon occurs, it is determined that a magnetic field with a strength equal to or lower than the set value has been applied, even when the cover portion has been repeatedly opened and closed. Thus, the operation of turning the screen on and off may not be normally performed.

Accordingly, as a result of the analysis of the reversal phenomenon, it can be seen that a reversal generally occurs in such a way that a magnetic field applied before the reversal is reversed into a magnetic field whose strength is symmetrical to the N pole (+) strength of the former magnetic field.

Accordingly, there is a need for an exception processing method that is configured to determine that the geomagnetic sensor has been reversed when a magnetic field having a strength of −1200 uT is applied, to determine that the cover portion has been opened in a state in which a magnetic field having a strength in the range of −1999 to −1200 uT is given, and to determine that the cover portion has been closed in the case of the other values.

Accordingly, when a magnetic field is initially applied from the S pole (−), the minimum value for an exception processing that is used to prevent turning off of a screen-off operation may be −1199 uT. However, it is preferred to adjust the minimum value for the exception processing up to −900 uT to allow for an error range.

That is, the method of controlling the operation of turning the screen of a portable device on and off according to the present invention uses a logic that performs operation control based on a range of +1200 to 1999 uT in the case of a normal standby state, and detects the reversal of the sensor and then performs operation control based on a range of −1999 to −1200 uT in the case of a magnetic field having a strength lower than −900 uT is suddenly applied.

In this case, the ranges may vary depending on the strength of the magnet. That is, in order to perform more accurate operation, additional exception rules may be applied. However, the above-described detection of the reversal phenomenon and corresponding operation patterns should be maintained.

Furthermore, the method of controlling the operation of turning the screen of a portable device on and off according to the present invention may include an option that allows a designated application to be automatically run at the same time that the screen is turned on.

That is, when a designated program is set in a control program according to the present invention, the designated program may appear on the screen at the same time that the screen is turned on.

In contrast, the control method may include an option that allows a running application to be automatically terminated at the same time that the screen is turned off.

Furthermore, when a minimum value for exception processing that is used to prevent a screen-off operation when a magnetic field is applied from an S pole (−) by the above-described reversal phenomenon is set to −1199 uT, it is preferred that a magnetic field shielding layer be added to the S pole (−) of the magnet in order to achieve more stable use, and thus in an normal state, the strength of a magnetic field appearing outside the cover portion exceeds −1199 uT.

In the present invention, a rubber magnet having no uniform polarity is used as an example of the magnetic field shielding layer.

Accordingly, a magnet having a double layer structure in which a rubber magnet has been added may be used as the plate-type magnet that is incorporated in the cover portion. It is preferable to incorporate the magnet so that the rubber magnet faces the outside of the cover portion and also a main magnet faces the portable device.

When the above-described method of controlling the operation of turning a screen on and off according to the present invention is used, the operation of turning a screen on and off can be smoothly controlled without requiring a special sensor device.

In particular, even if a dedicated sensor is additionally incorporated, it is difficult to overcome the problem that a screen is turned off when a magnetic field is applied from the S pole (−) as described above, that is, when the cover portion is folded backward and comes in contact with the back surface of the portable device. In contrast, in the present invention, the above-described particular problem can be completely overcome.

Specific examples of the structure of the protective case according to the present invention will be described below.

Figure 2:
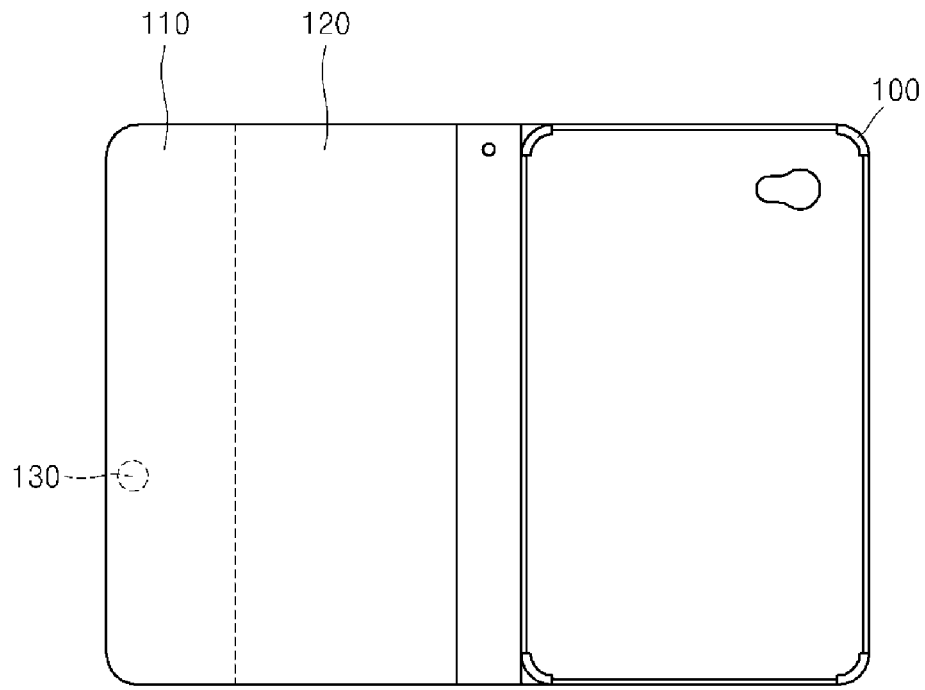
FIG. 2 shows the unfolded inside of a protective case having an injection-molding-type body fastening part according to the present invention.

First, FIG. 2 shows the inside of an unfolded protective case having an injection-molding-type body fastening part according to the present invention.

Referring to FIG. 2, an injection-molding-type body fastening part 100 configured to fasten a portable device is provided, and second and first cover portions 120 and 110 connected to the injection-molding-type body fastening part 100 are provided.

Figure 8:
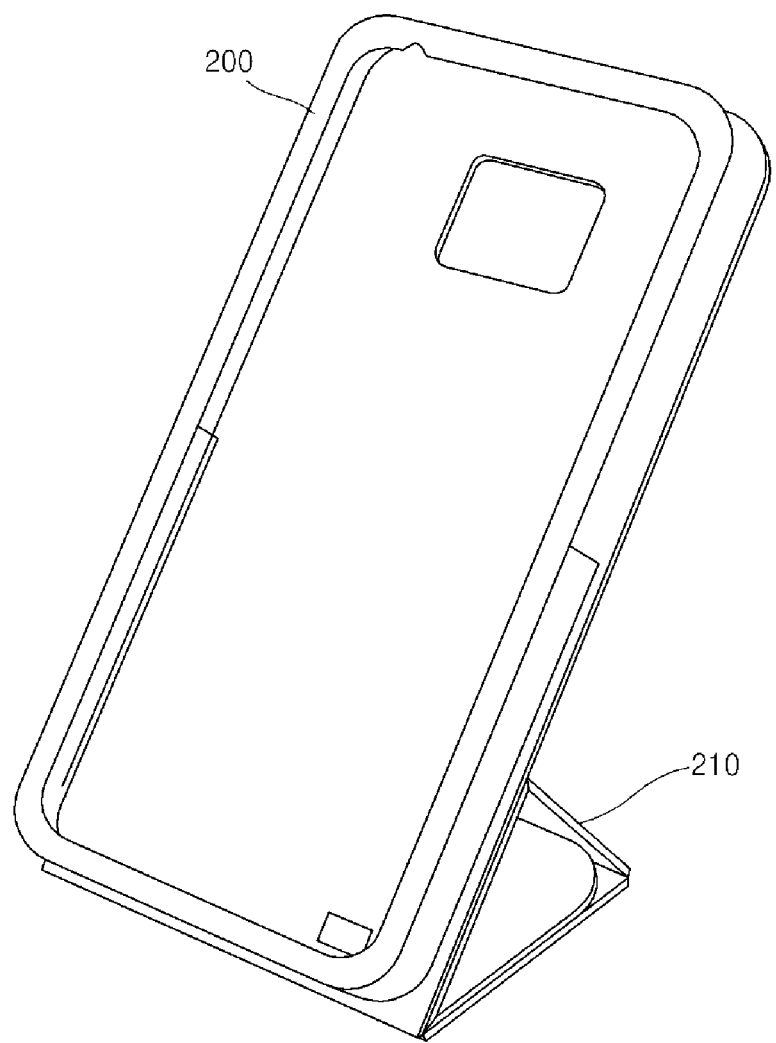
FIG. 8 is a perspective view showing the vertical resting of a protective case according to the present invention.

The reason why the cover portion is divided into the first and second portions is to achieve more promptly the effect of turning the screen on when the cover is closed and then opened. Furthermore, the effect of resting the portable device using the case can be achieved by adjusting the ratio between the portions, as shown in FIG. 8.

Furthermore, a magnet part 130 is incorporated at the location of the cover portion that faces the geomagnetic sensor of the portable device. In this case, although the magnet part 130 is shown as being incorporated in the first cover portion in this figure, it may be possible to change the location, for example, to a location of the second cover portion, as needed depending on the characteristics of the portable device.

Figure 3:
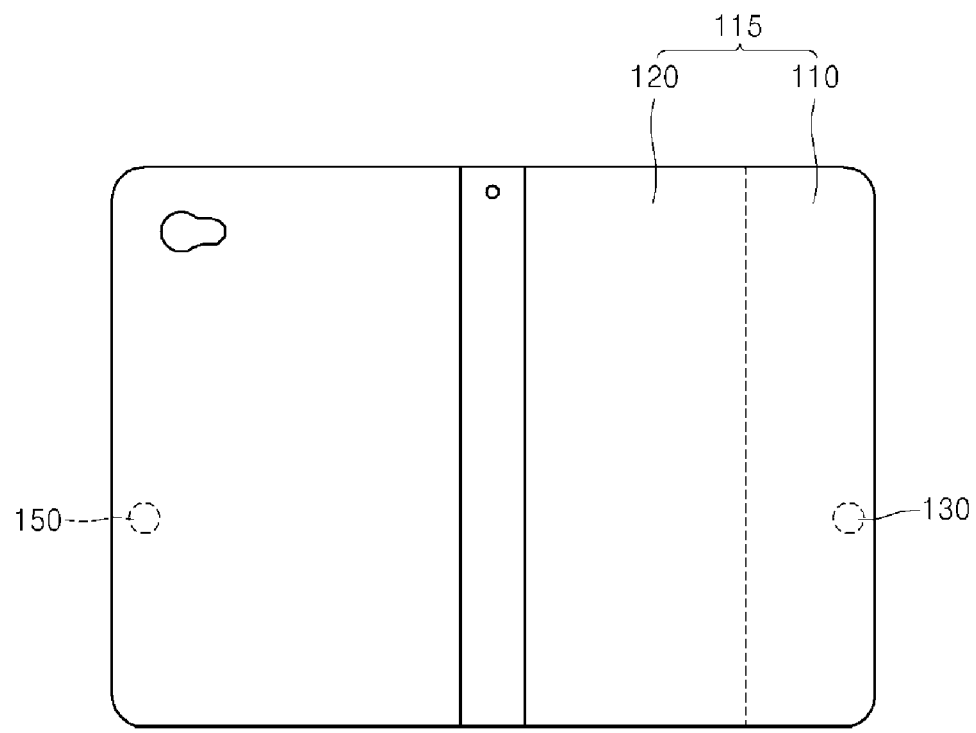
FIG. 3 shows the unfolded outside of the protective case having an injection-molding-type body fastening part according to the present invention.

FIG. 3 shows an outside of the unfolded protective case having the injection-molding-type body fastening part according to the present invention.

Referring to FIG. 3, it can be seen that shows the outer surface of the protective case according to the present invention.

An outer covers the surface of the body fastening part 100 shown in FIG. 2 in a way the body fastening part 100 is connected with the entire cover portion 115. However, the cover portion 115 that covers the entire portion of the device is merely an example, and is not limited thereto. Meanwhile, other main parts of the protective case in the present invention may employee parts that are currently used in the cases.

However, when viewed from the unfolded view, the magnet part 130 should be incorporated at a location that is symmetrical to that of the geomagnetic sensor incorporated portion 150 of the portable device.

In this case, the magnet part 130 may be shifted within 1 to 2 cm radius of the exact symmetric point. For example, the strength range of a magnetic field that operates with the cover according to the present invention can be from 1200 to 1999 uT. If a magnet used for the magnet part 130 inevitably generates a magnetic field having a strength of 2000 uT, the location of the magnet part 130 can be moved to a position shifted to be within the radius of 1 to 2 cm around the symmetric point. In this way, a magnetic field having an appropriate strength value can be applied. In this case, when the magnet part 130 is moved out of the radius of 2 cm, the operation of turning the screen on and off may not be normally performed, or the risk of an erroneous operation may occur.

Figure 4:
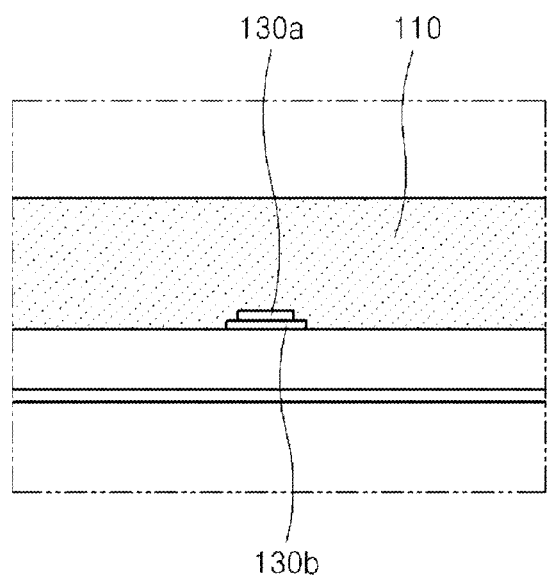
FIG. 4 shows the incorporation of a magnet part in the protective case according to the present invention.

FIG. 4 shows the incorporation of a magnet part in a protective case according to the present invention.

Referring to FIG. 4, the magnet part incorporated in a first cover portion 110 can be seen.

In this case, the magnet part according to the present invention is provided in a double-layer structure including a main magnet 130a and a rubber magnet 130b. This is intended to allow a magnetic field having strength in the stable range of 1200 to 1999 uT to be emitted from the main magnet 130a that comes into contact with the portable device. Meanwhile, the rubber magnet 130b cancels out an S-pole (−) magnetic field having a strength lower than −1200 uT applied from the main magnet 130a, so that the reversal detection of the program can be prevented, and the risk of an erroneous operation occurring when the cover portion is folded to the back of the portable device can be reduced.

Figure 5:
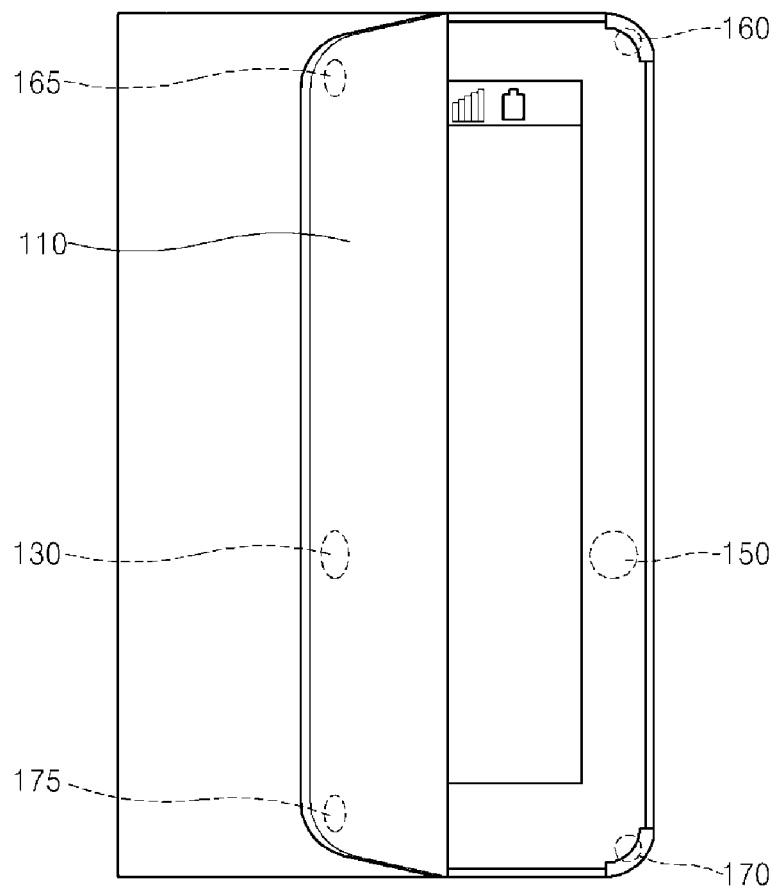
FIG. 5 shows the opened state of the protective case according to the present invention.

FIG. 5 shows the opened state of the protective case according to the present invention.

FIG. 5 shows the operation of turning a screen on when only the first cover portion 110 of the cover portion of a protective case according to the present invention is opened. The operation of turning the screen on can be performed using a lower magnitude of force by dividing the cover portion into sub-portions. Furthermore, more rapid manipulation can be achieved by reducing the time required to unfold a cover.

Furthermore, the protective case according to the present invention is configured such that cover fastening support parts 160 and 170 are formed on the corners where the cover portion and a body fastening part come into contact. Thus, the problem that a geomagnetic sensor incorporated portion 150 and a magnet part 130 are offset and an erroneous operation is generated, by pushing of the cover portion can be overcome.

In this case, the cover fastening support parts 160 and 170 may be fabricated in the form of corner holder into which the corners of the cover portion can be inserted. Furthermore, the cover portion can be made to come more tightly into contact with the portable device by incorporating magnets inside the cover fastening support parts 160 and 170 and also incorporating cover fastening magnets 165 and 175 in the corresponding portions of the cover portion. Additionally, the magnet part 130 can be made to more tightly in contact with the portable device, so that the sensing performance of the geomagnetic sensor incorporated portion 150 can be improved and also the operation of turning the screen on and off can be more smoothly performed.

Figure 6:
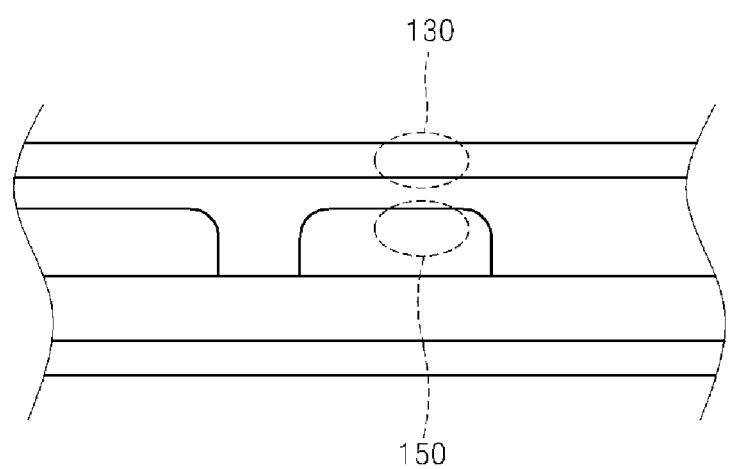
FIG. 6 shows the closed state of the protective case according to the present invention.

FIG. 6 shows the closed state of the protective case according to the present invention.

FIG. 6 shows a state in which the magnet part 130 and the geomagnetic sensor incorporated portion 150 comes into a tight contact when the cover portion of the protective case of the portable device is closed. In order to maintain the above tight contact state, the cover fastening support parts 160 and 170 shown in FIG. 5 should be operated reliably.

However, in the case of a device having no large-sized screen, such as a smart pad, it may be difficult to fabricate reliable cover fastening support parts.

Accordingly, in a small device, such as a smart phone, additional fastening parts may be connected to and used along with the cover portion.

Figure 7:
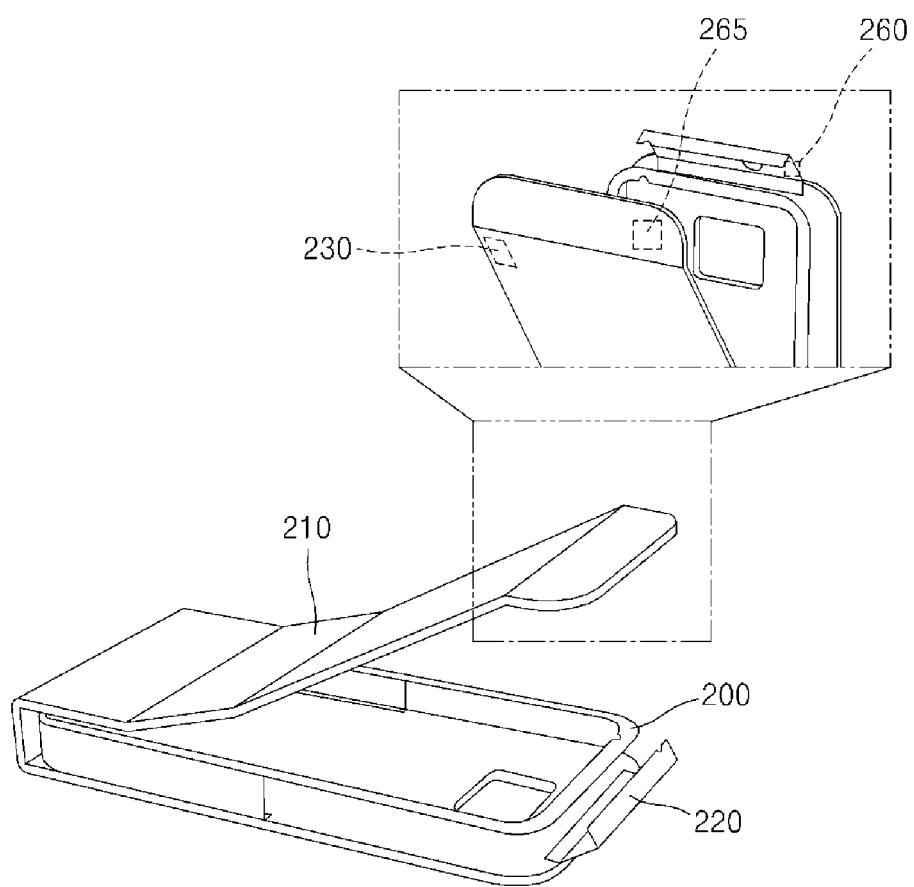
FIG. 7 is a schematic view showing a protective case having a bezel-type body fastening part according to the present invention.

FIG. 7 is a schematic view showing a protective case having a bezel-type body fastening part according to the present invention.

FIG. 7 is a schematic view showing a cover fastening support part 260 and a cover fastening magnet 265 in a smart phone-dedicated case.

In order to protect a small device, such as a smart phone, it is preferable to use a bezel-type body fastening part 200 that is made of leather. In this case, an accommodating and fastening part 220 configured to allow the portable device to be accommodated and fastened in the body fastening part 200 may be further used. Accordingly, it is preferred that the accommodating and fastening part 220 include an anti-slip material on a surface thereof that comes into contact with the portable device. Furthermore, the cover fastening support parts 260 may be incorporated in the accommodating and fastening part 220.

Furthermore, cover fastening support parts may be further formed on the bezel-type body fastening part 200, as formed in FIG. 5.

Moreover, the protective case for a smart phone according to the present invention may enable itself to function as a stand by dividing an upper cover portion 210 into four parts.

FIG. 8 is a perspective view showing the vertical resting of the protective case according to the present invention.

FIG. 8 shows that the protective case having the body fastening part 200 functions as a stand as a result of the folding of the cover portion 210, as illustrated in FIG. 7.

As described above, using the protective case and the control method using the protective case according to the present invention, buttons do not need to be directly manipulated to turn the screen of the portable device on and off, and a device can be rapidly manipulated only by a natural operation that is similar to the operation of opening and closing a book.

Furthermore, the portable device can be supported using its own case, and rapid manipulation can be performed.

The invention claimed is:

1. A case for a portable device provided with a screen and a sensor, wherein the sensor is configured to sense a magnetic field, and the screen is configured to be turned on or off depending on the sensed magnetic field, the case comprising:
   a cover portion configured to cover the screen of the portable device, and foldable to a back surface of the portable device;
   a magnet part incorporated in the cover portion at a location corresponding to the sensor of the portable device; and
   wherein the magnet part has a double layer structure comprising a main magnet and a magnetic field shielding layer, the main magnet comes into contact with the screen of the portable device when the cover portion covers the screen of the portable device, and the magnetic field shielding layer is attached on the main magnet and comes into contact with the back surface of the portable device when the cover portion is folded to the back surface of the portable device, the magnetic field shielding layer is configured to prevent the screen from being turned off by a magnetic field from the magnet part when the cover portion is folded to the back surface of the portable device by cancelling out the magnetic field with a strength lower than a predetermined strength applied from the main magnet.

2. The case of claim 1, wherein the magnetic field shielding layer does not have a uniform polarity.

3. The case of claim 1, further comprises a body fastening part to accommodate a body of the portable device.

4. The case of claim 3, wherein the cover portion is connected to one side of the body fastening part.

5. The case of claim 1, wherein the magnet part is incorporated in the cover portion such that an N-pole of the magnet part faces the sensor of the portable device, when the cover portion comes into contact with the screen.

6. The case of claim 1, where the magnetic field shielding layer is made of rubber magnet.

7. A case for a portable device provided with a screen and a geomagnetic sensor, wherein the geomagnetic sensor is configured to sense a magnetic field, and the screen is configured to be turned on or off depending on the sensed magnetic field, the case comprising:
   a cover portion configured to cover the screen of the portable device, and foldable to a back surface of the portable device;
   a magnet part incorporated in the cover portion at a location corresponding to the geomagnetic sensor of the portable device; and
   wherein the magnet part has a double layer structure comprising a main magnet and a magnetic field shielding layer, the main magnet comes into contact with the screen of the portable device when the cover portion covers the screen of the portable device, and the magnetic field shielding layer is attached on the main magnet and comes into contact with the back surface of the portable device when the cover portion is folded to the back surface of the portable device, the magnetic field shielding layer is configured to prevent the screen from being turned off by a magnetic field from the magnet part when the cover portion is folded to the back surface of the portable device by cancelling out the magnetic field with a strength lower than a predetermined strength applied from the main magnet.

8. The case of claim 7, wherein the magnetic field shielding layer is added to the magnet part to form a double layer structure.

9. The case of claim 7, wherein the magnetic field shielding layer does not have a uniform polarity.

10. The case of claim 7, further comprises a body fastening part to accommodate a body of the portable device.

11. The case of claim 10, wherein the cover portion is connected to one side of the body fastening part.

12. The case of claim 7, wherein the magnetic part is incorporated in the cover portion such that an N-pole of the magnet part faces the sensor of the portable device, when the cover portion comes into contact with the screen.

13. The case of claim 7, where the magnetic field shielding layer is made of rubber magnet.

14. A method of controlling an operation of turning a screen of a portable device on and off, the method controlling:
   incorporating a magnet part in a cover portion of a protective case of the portable device, allowing the magnet part to apply a magnetic field signal to a geomagnetic sensor of the portable device when the cover portion comes into contact with the portable device;
   allowing the geomagnetic sensor to detect the magnetic field signal;
   turning the screen of the portable device off when a strength of the magnetic field signal is in a first predetermined range, and turning the screen of the portable device on when the magnetic field signal is removed;
   determining that a geomagnetic sensor reversal phenomenon occurs when a strength of the magnetic field signal is in a second predetermined range; and
   when the geomagnetic sensor reversal phenomenon occurs, determining the cover portion is opened when a strength of the magnetic field signal is in a third predetermined range, and determining the cover portion is closed when a strength of the magnetic field signal is in a range other than the third predetermined range.

15. The method of claim 14, wherein the magnetic field signal uses 1200 to 1999 uT.

16. The method of claim 15, further comprising:
   applying an exceptional rule that prevents the screen from being turned on or off when the magnetic field signal has a strength in a range of −900 to 0 uT.

17. The method of claim 14, further comprising:
   applying an exceptional rule that prevents the screen from being turned on or off when the magnetic field signal has a strength in a range of −1199 to 0 uT.

18. The method of claim 14, further comprising:
   applying an exceptional rule that determines that the signal detected by the geomagnetic sensor is reversed when the magnetic field signal has a strength lower than −1199 uT and that allows the screen to be turned on when the magnetic field signal has a strength in a range of −1999 to −1200 uT.

19. The method of claim 14, wherein the method includes an option that allows a designated application to be executed at the same time when the screen is turned on.

20. The method of claim 14, wherein the method includes an option that allows a running application to be automatically terminated at the same time when the screen is turned off.

* * * * *